(12) United States Patent
Vargas

(10) Patent No.: US 6,940,303 B2
(45) Date of Patent: Sep. 6, 2005

(54) SYSTEM AND METHOD TO ESTABLISH AN ADJUSTABLE ON-CHIP IMPEDANCE

(76) Inventor: Roy L. Vargas, 9101 Sommerland Way, Austin, TX (US) 78749

( * ) Notice: Subject to any disclaimer, the term of this patent is extended or adjusted under 35 U.S.C. 154(b) by 85 days.

(21) Appl. No.: 10/721,203

(22) Filed: Nov. 25, 2003

(65) Prior Publication Data

US 2004/0104757 A1 Jun. 3, 2004

Related U.S. Application Data

(60) Provisional application No. 60/429,941, filed on Nov. 29, 2002.

(51) Int. Cl.$^7$ ............................................. H03K 19/003
(52) U.S. Cl. ........................................... 326/30; 326/34
(58) Field of Search ...................................... 326/30–34

(56) References Cited

U.S. PATENT DOCUMENTS 6,157,206 A * 12/2000 Taylor et al. ................. 326/30
6,603,329 B1 * 8/2003 Wang et al. .................. 326/30
6,836,144 B1 * 12/2004 Bui et al. ..................... 326/32

* cited by examiner

*Primary Examiner*—James H. Cho
(74) *Attorney, Agent, or Firm*—Garlick, Harrison & Markison

(57) ABSTRACT

A method to establish an adjustable on-chip impedance within a predetermined range that involves establishing a reference current for the adjustable on-chip impedance and applying this reference current to the adjustable on-chip impedance. A voltage produced by applying the reference current to the adjustable on-chip impedance is sensed and compared with the comparator or other similar processor to a reference voltage. This comparison allows the adjustable on-chip impedance to be tuned when the comparison of the sense voltage and the reference voltage is unfavorable. Tuning the impedance results in an impedance value within a predetermined range that accounts for variances of both the reference current and reference voltage.

12 Claims, 7 Drawing Sheets

TERMINATION IMPEDANCE MODULE 70

TERMINATION IMPEDANCE MODULE 70

SYSTEM AND METHOD TO ESTABLISH AN ADJUSTABLE ON-CHIP IMPEDANCE

RELATED APPLICATIONS

This application claims priority under 35 USC § 119(e) to U.S. Provisional Application No. 60/429,941 filed Nov. 29, 2002 entitled, "MULTI-FUNCTION HANDHELD DEVICE", and is incorporated herein by reference in its entirety.

TECHNICAL FIELD OF THE INVENTION

The present invention relates generally to controlling variable impedances, and more particularly, to a system and method to establish an adjustable on-chip impedance within a predetermined range.

BACKGROUND OF THE INVENTION

As is known, integrated circuits are used in a wide variety of electronic equipment, including portable, or handheld, devices. Such handheld devices include personal digital assistants (PDA), CD players, MP3 players, DVD players, AM/FM radio, a pager, cellular telephones, computer memory extension (commonly referred to as a thumb drive), etc. Each of these handheld devices includes one or more integrated circuits to provide the functionality of the device. For example, a thumb drive may include an integrated circuit for interfacing with a computer (e.g., personal computer, laptop, server, workstation, etc.) via one of the ports of the computer (e.g., Universal Serial Bus, parallel port, etc.) and at least one other memory integrated circuit (e.g., flash memory). As such, when the thumb drive is coupled to a computer, data can be read from and written to the memory of the thumb drive. Accordingly, a user may store personalized information (e.g., presentations, Internet access account information, etc.) on his/her thumb drive and use any computer to access the information.

As another example, an MP3 player may include multiple integrated circuits to support the storage and playback of digitally formatted audio (i.e., formatted in accordance with the MP3 specification). As is known, one integrated circuit may be used for interfacing with a computer, another integrated circuit for generating a power supply voltage, another for processing the storage and/or playback of the digitally formatted audio data, and still another for rendering the playback of the digitally formatted audio data audible.

Integrated circuits have enabled the creation of a plethora of handheld devices, which may link to one another. For example, one may link any combination of the following devices: a cellular telephone, a PDA, one or more thumb drives for extended memory functionality, an MP3 (audio or multimedia) player for storage and/or playback of digitally recorded media. To ensure proper connections between devices, termination impedance (e.g., a resistor) is used to ensure each device can properly interface with one another. To do this, the terminal resistor needs to be a precision resistor (e.g., a tolerance of +/−5%), which is very difficult to achieve in an acceptable die area of an integrated circuit.

Therefore, a need exists for integrated circuits that establish impedances (such as termination impedances) within specific predetermined values.

SUMMARY OF THE INVENTION

The present invention provides a method to establish an adjustable on-chip impedance within a predetermined range to substantially meet this need and others. This method involves establishing a reference current for the adjustable on-chip impedance and applying this reference current to the adjustable on-chip impedance. A voltage produced by applying the reference current to the adjustable on-chip impedance is sensed and compared with the comparator or other similar processor to a reference voltage. This comparison allows the adjustable on-chip impedance to be tuned when the comparison of the sense voltage and the reference voltage is unfavorable. Tuning the impedance results in an impedance value within a predetermined range that accounts for variances of both the reference current and reference voltage.

In another embodiment, a voltage difference between the sensed voltage and the reference voltage is used to calculate an impedance adjustment. The reference voltage may correspond to a low threshold of a range of acceptable impedances or a high threshold of a range of acceptable impedances. This impedance may correspond to a terminal resistor for a universal serial bus (USB) transmit line or other similar interface.

In another embodiment, a calibration circuit establishes an impedance value of an adjustable on-chip impedance within a predetermined range. The calibration circuit, located within an integrated circuit, includes a reference current source to provide a reference current that is applied to the adjustable on-chip impedance. A comparator is operably coupled to sense and compare the voltage generated across the adjustable on-chip impedance to a reference voltage. The comparator provides an output that indicates the difference between the sensed voltage and the reference voltage or indicates whether or not the comparison of the sensed voltage and reference voltage is favorable. A tuning module receives the output of the comparator and may increment, decrement, or adjust the on-chip impedance when the comparison of the sensed voltage and reference voltage is unfavorable. This results in an altered impedance value of the adjustable on-chip impedance being tuned towards a predetermined range. This predetermined range may account for variances of both the reference current and reference voltage. The reference current and reference voltage may both be derived from a bandgap voltage to help account for these variances. The tuning process continues as long as the comparison between the sensed voltage and reference voltage is unfavorable. This calibration circuit may be incorporated within an integrated circuit such as an audio processor or other multi-function device and serve to adjust the impedance of a terminal resistor used within an interface that couples the integrated circuit with another device.

Another embodiment takes the form of a termination impedance module for use within a USB transmit line or other like device that operably couples an integrated circuit to another device. The termination impedance module requires an impedance value within a predetermined range. To achieve this, the impedance module utilizes an adjustable on-chip impedance operably coupled to a reference current source. A voltage across the adjustable on-chip impedance is sensed and compared with a reference voltage. A comparator operably couples to sense and compare the voltage generated from the reference current and the adjustable on-chip impedance with a reference voltage. The comparator provides an output that indicates when the comparison of the sense voltage and the reference voltage is unfavorable. This output is received by a tuning module, which issues a control signal to adjust the adjustable on-chip impedance when the reference voltage is unfavorable. The tuning module continues to adjust the adjustable on-chip impedance until the comparison of the sense voltage and reference voltage is no longer unfavorable.

Yet another embodiment takes the form of an audio processing integrated circuit having a processing module, memory, an interface to external memory and a bus operably coupled to allow the exchange of information between the processing module, memory and memory interface. A USB or other like interface couples to the bus and allows the audio processing integrated circuit to interface with external devices. This USB interface includes a calibration circuit that adjusts a termination impedance of the USB lines to ensure that the termination impedance is within a predetermined range.

DETAILED DESCRIPTION OF THE INVENTION

Figure 1:
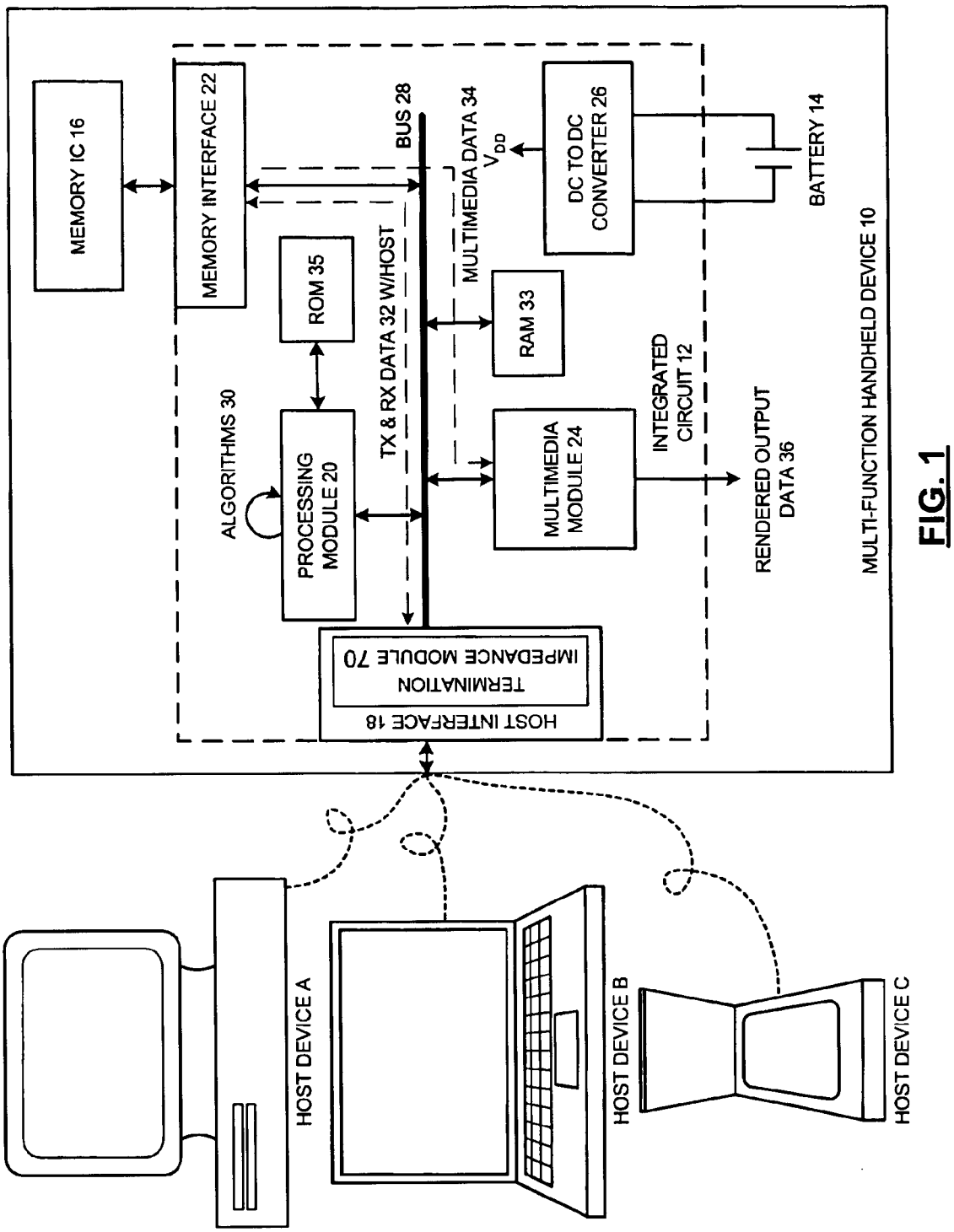
FIG. 1 shows a schematic block diagram of a multiple function handheld device in accordance with the present invention.

FIG. 1 is a schematic block diagram of a multi-function handheld device 10 and corresponding integrated circuit 12 operably coupled to a host device A, B, or C. The multi-function handheld device 10 also includes memory integrated circuit (IC) 16 and a battery 14. The integrated circuit 12 includes a host interface 18, a processing module 20, a memory interface 22, a multimedia module 24, a DC-to-DC converter 26, and a bus 28. The multimedia module 24 alone or in combination with the processing module 20 provides the functional circuitry for the integrated circuit 12. The DC-to-DC converter 26, which may be constructed in accordance with the teaching of U.S. Pat. No. 6,204,651, entitled METHOD AND APPARATUS FOR REGULATING A DC VOLTAGE, provides at least a first supply voltage to one or more of the host interface 18, the processing module 20, the multimedia module 24, and the memory interface 22. The DC-to-DC converter 26 may also provide $V_{DD}$ to one or more of the other components of the handheld device 10.

When the multi-function handheld device 10 is operably coupled to a host device A, B, or C, which may be a personal computer, workstation, server (which are represented by host device A), a laptop computer (host device B), a personal digital assistant (host device C), and/or any other device that may transceive data with the multi-function handheld device, the processing module 20 performs at least one algorithm 30, where the corresponding operational instructions of the algorithm 30 are stored in memory 16 and/or in memory incorporated in the processing module 20. The processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

With the multi-function handheld device 10 in the first functional mode, the integrated circuit 12 facilitates the transfer of data between the host device A, B, or C (through host interface 18 having termination impedance module 70) and memory 16, which may be non-volatile memory (e.g., flash memory, disk memory, SDRAM) and/or volatile memory (e.g., DRAM). In one embodiment, the memory IC 16 is a NAND flash memory that stores both data and the operational instructions of at least some of the algorithms 30.

In this mode, the processing module 30 retrieves a first set of operational instructions (e.g., a file system algorithm, which is known in the art) from the memory 16 to coordinate the transfer of data. For example, data received from the host device A, B, or C (e.g., Rx data) is first received via the host interface module 18. Depending on the type of coupling between the host device and the handheld device 10, the received data will be formatted in a particular manner. For example, if the handheld device 10 is coupled to the host device via a USB cable, the received data will be in accordance with the format proscribed by the USB specification. Termination impedance module 70 helps to ensure impedances are probably matched between the integrated circuit 12 and host device. The host interface module 18 converts the format of the received data (e.g., USB format) into a desired format by removing overhead data that corresponds to the format of the received data and storing the remaining data as data words. The size of the data words generally corresponds directly to, or a multiple of, the bus width of bus 28 and the word line size (i.e., the size of data stored in a line of memory) of memory 16. Under the control of the processing module 20, the data words are provided, via the memory interface 22, to memory 16 for storage. In this mode, the handheld device 10 is functioning as extended memory of the host device (e.g., like a thumb drive).

In furtherance of the first functional mode, the host device may retrieve data (e.g., Tx data) from memory 16 as if the memory were part of the computer. Accordingly, the host device provides a read command to the handheld device, which is received via the host interface 18. The host interface 18 converts the read request into a generic format and provides the request to the processing module 20. The processing module 20 interprets the read request and coordinates the retrieval of the requested data from memory 16 via the memory interface 22. The retrieved data (e.g., Tx data) is provided to the host interface 18, which converts the format of the retrieved data from the generic format of the handheld device into the format of the coupling between the handheld device and the host device. The host interface 18 then provides the formatted data to the host device via the coupling.

The coupling between the host device and the handheld device may be a wireless connection or a wired connection. For instance, a wireless connection may be in accordance with Bluetooth, IEEE 802.11(a), (b) or (g), and/or any other wireless LAN (local area network) protocol, IrDA, etc. The wired connection may be in accordance with one or more Ethernet protocols, Firewire, USB, etc. Depending on the particular type of connection, the host interface module 18 includes a corresponding encoder and decoder. For example, when the handheld device 10 is coupled to the host device via a USB cable, the host interface module 18 includes a USB encoder and a USB decoder. Termination impedance module 70 ensures proper impedance matching between the host and integrated circuit 12.

As one of average skill in the art will appreciate, the data stored in memory 16, which may have 64 Mbytes or greater of storage capacity, may be text files, presentation files, user profile information for access to varies computer services (e.g., Internet access, email, etc.), digital audio files (e.g., MP3 files, WMA—Windows Media Architecture-, MP3 PRO, Ogg Vorbis, AAC—Advanced Audio Coding), digital video files [e.g., still images or motion video such as MPEG (motion picture expert group) files, JPEG (joint photographic expert group) files, etc.], address book information, and/or any other type of information that may be stored in a digital format. As one of average skill in the art will further appreciate, when the handheld device 10 is coupled to the host device A, B, or C, the host device may power the handheld device 10 such that the battery is unused.

When the handheld device 10 is not coupled to the host device, the processing module 20 executes an algorithm 30 to detect the disconnection and to place the handheld device in a second operational mode. In the second operational mode, the processing module 20 retrieves, and subsequently executes, a second set of operational instructions from memory 16 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, the multimedia module 24 converts the data 34 into rendered output data 36. For example, the multimedia module 24 may convert digitized data into analog signals that are subsequently rendered audible via a speaker or via a headphone jack. In addition, or in the alternative, the multimedia module 24 may render digital video data and/or digital text data into RGB (red-green-blue), YUV, etc., data for display on an LCD (liquid crystal display) monitor, projection CRT, and/or on a plasma type display. The multimedia module 24 will be described in greater detail with reference to FIGS. 2 and 3.

As one of average skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 2:
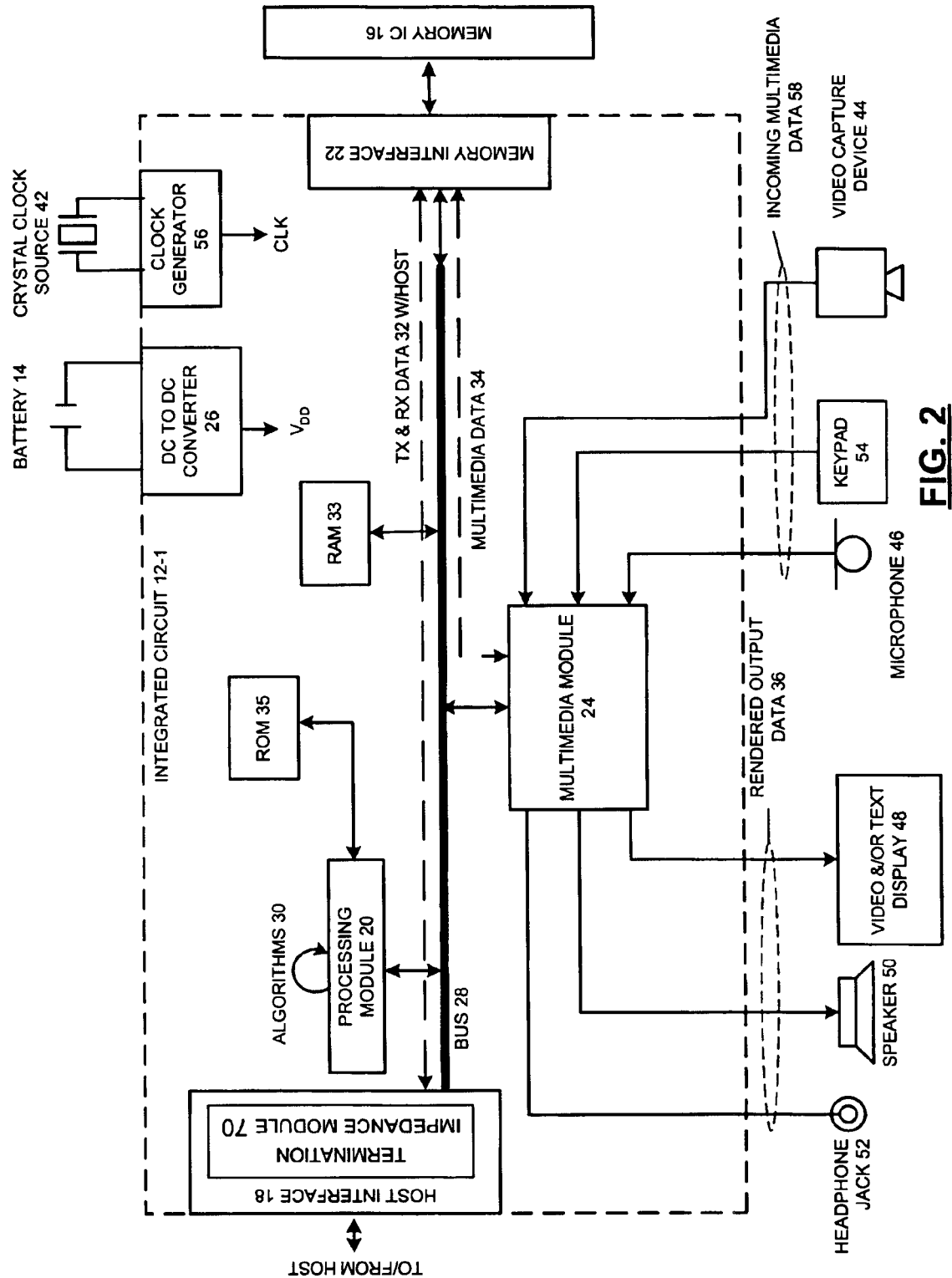
FIG. 2 is a schematic block diagram of a handheld device in accordance with the present invention.

FIG. 2 is a schematic block diagram of another handheld device 40 and a corresponding integrated circuit 12-1. In this embodiment, the handheld device 40 includes the integrated circuit 12-1, the battery 14, the memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The integrated circuit 12-1 includes the host interface 18, the processing module 20, the memory interface 22, the multimedia module 24, the DC-to-DC converter 26, and a clock generator 56, which produces a clock signal (CLK) for use by the other modules. As one of average skill in the art will appreciate, the clock signal CLK may include multiple synchronized clock signals at varying rates for the various operations of the multi-function handheld device.

Handheld device 40 functions in a similar manner as handheld device 10 when exchanging data with the host device (i.e., when the handheld device is in the first operational mode). In addition, while in the first operational mode, the handheld device 40 may store digital information received via one of the multimedia input devices 44, 46, and 54. For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the keypad 54 (which may be a keyboard, touch screen interface, or other mechanism for inputting text information) provides text data to the multimedia module 24 for storage as digital text data in memory 16. In this extension of the first operational mode, the processing module 20 arbitrates write access to the memory 16 among the various input sources (e.g., the host and the multimedia module).

When the handheld device 40 is in the second operational mode (i.e., not connected to the host), the handheld device may record and/or playback multimedia data stored in the memory 16. Note that the data provided by the host when the handheld device 40 was in the first operational mode includes the multimedia data. The playback of the multimedia data is similar to the playback described with reference to the handheld device 10 of FIG. 1. In this embodiment, depending on the type of multimedia data 34, the rendered output data 36 may be provided to one or more of the multimedia output devices. For example, rendered audio data may be provided to the headphone jack 52 an/or to the speaker 50, while rendered video and/or text data may be provided to the display 48.

The handheld device 40 may also record multimedia data 34 while in the second operational mode. For example, the handheld device 40 may store digital information received via one of the multimedia input devices 44, 46, and 54.

Figure 3:
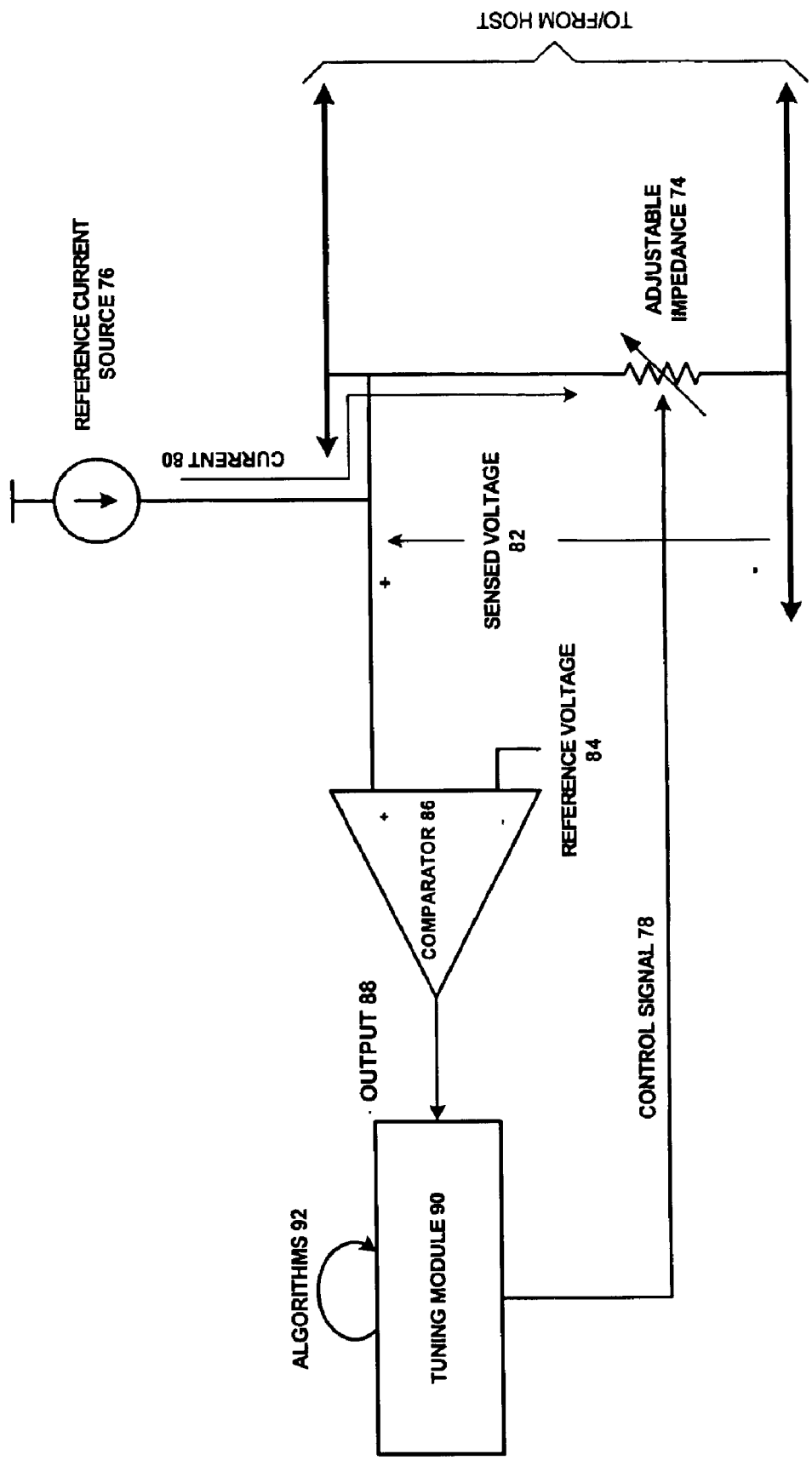
FIG. 3 is a schematic of an adjustable on-chip impedance module in accordance with the present invention.

FIG. 3 is a schematic of one embodiment of termination impedance module 70. This module includes reference current source 76, adjustable impedance 74, comparator 86 and tuning module 90. Sensed voltage 82 is measured across adjustable impedance 74 and compared with reference voltage 84. Tuning module 90 executes algorithms 92 to produce control signal 78.

Reference current source 76 provides a reference current 80 applied to adjustable impedance 74. Adjustable impedance 74 serves as the termination impedance that interfaces with a host device. The application of current 80 to adjustable impedance 74 results in a voltage that is depicted as sensed voltage 82. Sensed voltage 82 and reference voltage 84 are both applied to comparator 86. Comparator 86 generates an output 88 for tuning module 90. Output 88 indicates whether or not the comparison between sensed voltage 82 and reference voltage 84 is favorable. Tuning module 90, having output 88, executes tuning algorithms 72 to generate a control signal 78. Control signal 78 directs an adjustment to adjustable impedance 74. For example, when the reference voltage corresponds to a lower threshold value, and output 88 is unfavorable, control signal 78 may direct that adjustable impedance 74 be incremented until output 88 is favorable. Similarly, control signal 78 may direct that adjustable impedance 74 be decremented when the reference voltage corresponds to a high threshold level and the comparison is unfavorable. Adjustable impedance 74 serves as the terminal resistor on a USB line. By using on-chip reference current source 76 and reference voltage 84 that derive from the same bandgap voltage common errors between the reference current source 76 and reference voltage 84 essentially cancel themselves out when adjusting the termination impedance. These errors, which are known in a worst case, can be factored in to establish an appropriate range for adjustable impedance 74. This will ensure that the termination impedance as seen from the host is always within a predetermined or specified range.

In another embodiment, comparator 86 may provide an output 88 that describes the difference between sensed voltage 82 and reference voltage 84. Tuning module 90 to calculate a change to adjustable impedance 74 uses this difference. This change is directed by control signal 78 to adjustable impedance 74. This ability allows the tuning process to become a single step or reduced number of steps as opposed to the above described iterative.

Figure 4:
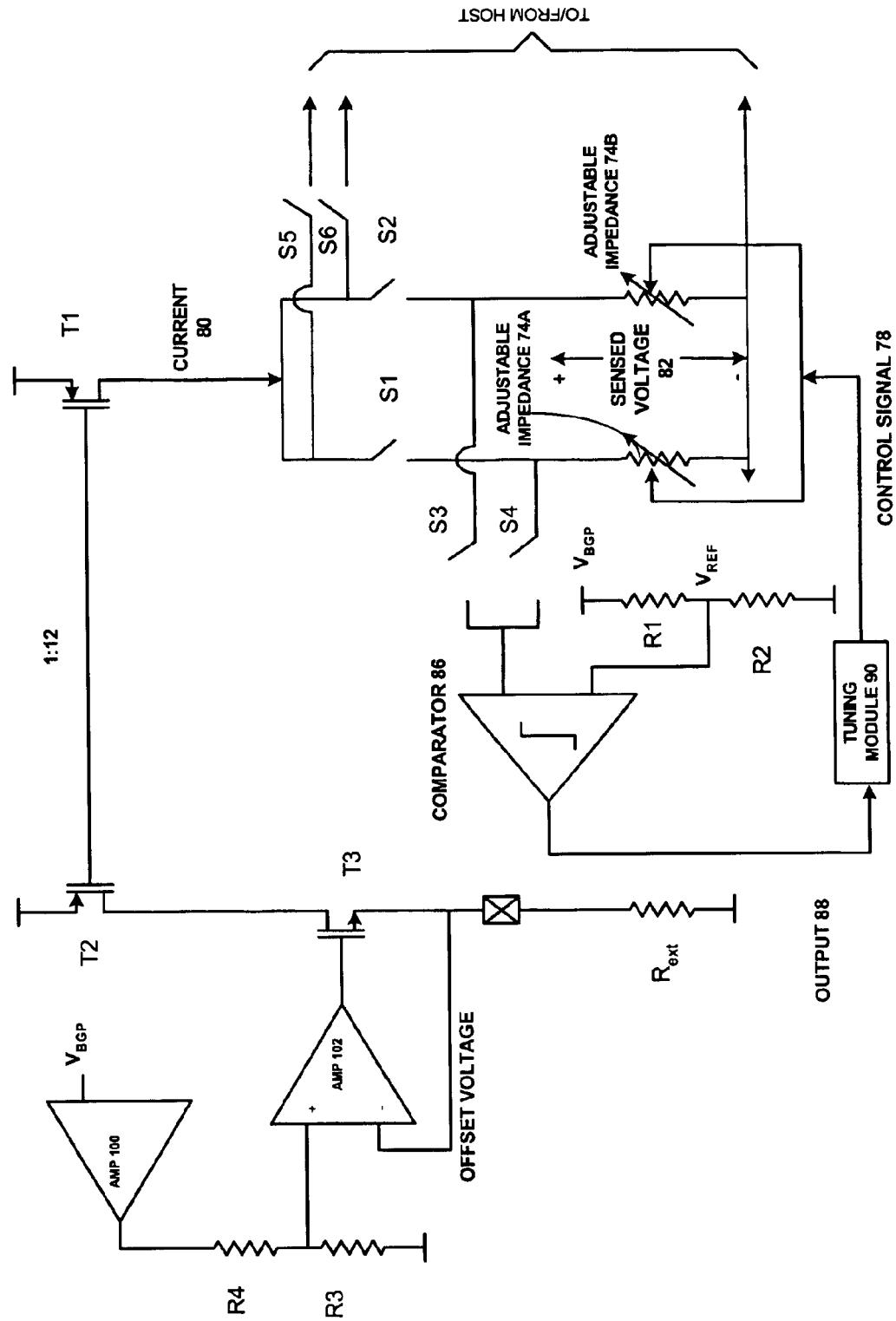
FIG. 4 is a schematic illustrating another embodiment of the tuning module in accordance with the present invention.

FIG. 4 illustrates another embodiment of termination impedance module 70. Amplifiers 100 and 102, precision resistor $R_{ext}$ and transistor $T_3$ produce a precision current for transistor $T_2$, which functions as a current mirror for $T_1$. Accordingly, based on size scaling between $T_2$ and $T_1$, the same, or a scaled, current will flow through $T_1$. Either Adjustable Impedance 74A or 74B is placed in service depending on the positions of switches S1 and S2. To calibrate adjustable impedance 74A and 74B, switch S3 and S4 select the sensed voltage across adjustable impedance 74A and 74B as an input to comparator 86.

Comparator 86 generates output 88 for tuning module 90. As described in FIG. 3, output 88 indicates whether or not the comparison between sensed voltage 82 and reference voltage 84 is favorable. Tuning module generates control signal 78 that adjusts either adjustable impedance 74A or 74B.

Current 80 and reference voltage ($V_{ref}$) 84 both are derived from the same bandgap voltage. Several independent sources of error exist in the design. These include the accuracy of the current mirror, voltage offsets in the comparator, voltage offsets in the amplifier used in generating the reference current. In the present invention, these errors are considered in the design. By using the same bandgap voltage, any error in the bandgap voltage will exist on both the reference current 80 and the reference voltage 84. Thus these errors essentially cancel out and make inaccuracies in the bandgap much less significant. The termination resistance is established with an appropriate range for adjustable impedances 74A and 74B that accounts for variance of the reference current and the reference voltage. This range is more accurate than previous solutions offered, as inaccuracies in the bandgap are much less significant.

Figure 5:
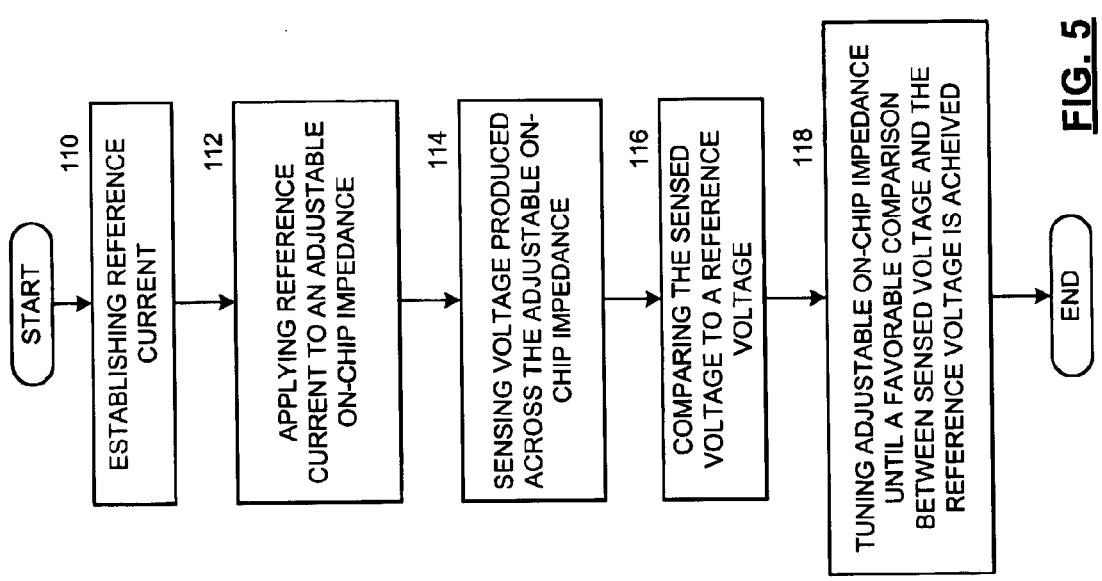
FIG. 5 is a logic flow diagram illustrating one process for tuning an adjustable on-chip impedance in accordance with the present invention.

FIG. 5 is a logic flow diagram of one method to establish an adjustable on-chip impedance within a predetermined range. This process involves establishing the reference current at Step 110. This reference current is applied to an adjustable on-chip impedance at Step 112. The voltage generated by applying the reference current to the adjustable on-chip impedance is sensed in Step 114 and compared to a reference voltage in Step 116. The results of this comparison are used to tune or alter the adjustable on-chip impedance until a favorable comparison between the sense voltage and the reference voltage is achieved in Step 118.

Figure 6:
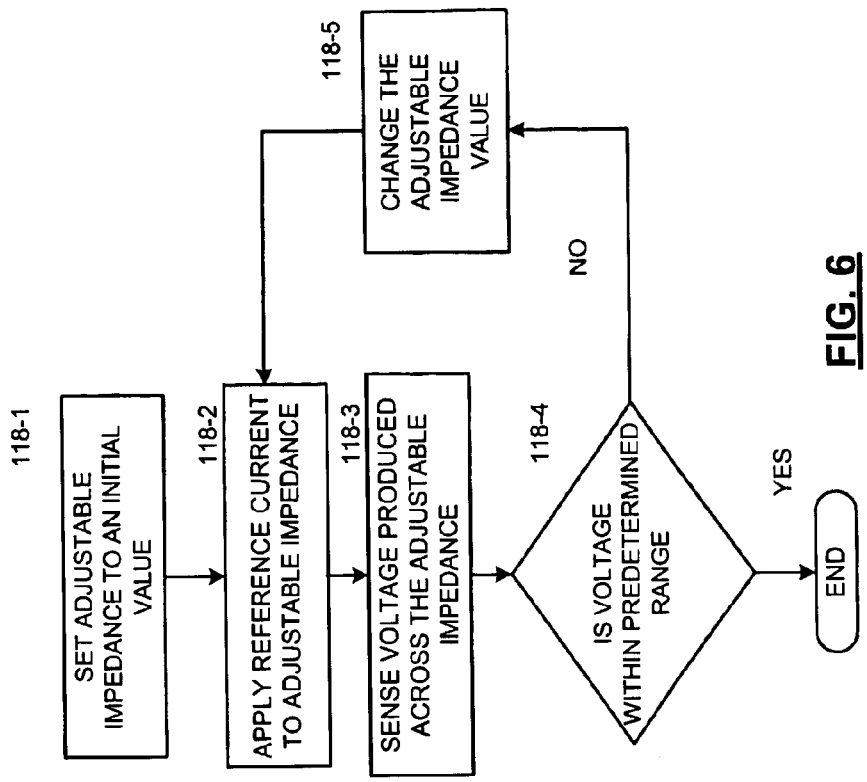
FIG. 6 is a logic diagram illustrating one embodiment of tuning the adjustable on-chip impedance in accordance with the present invention.

FIG. 6 contains process Steps 118-1 through Steps 118-5 that depict one method in which the adjustable on-chip impedance may be tuned. At Step 118-1 the adjustable impedance is set to an initial value. In Steps 118-2 the reference current is applied to the adjustable impedance. This application results in a sensed voltage at Step 118-3. At Step 118-4 a determination is made as to whether or not the voltage is within the predetermined range. If it is not, the adjustable impedance is changed in Step 118-5 and the reference current is again applied to the adjustable impedance as the process returns to Steps 118-2. Otherwise, if the voltage is within a predetermined range, the tuning process is completed.

Figure 7:
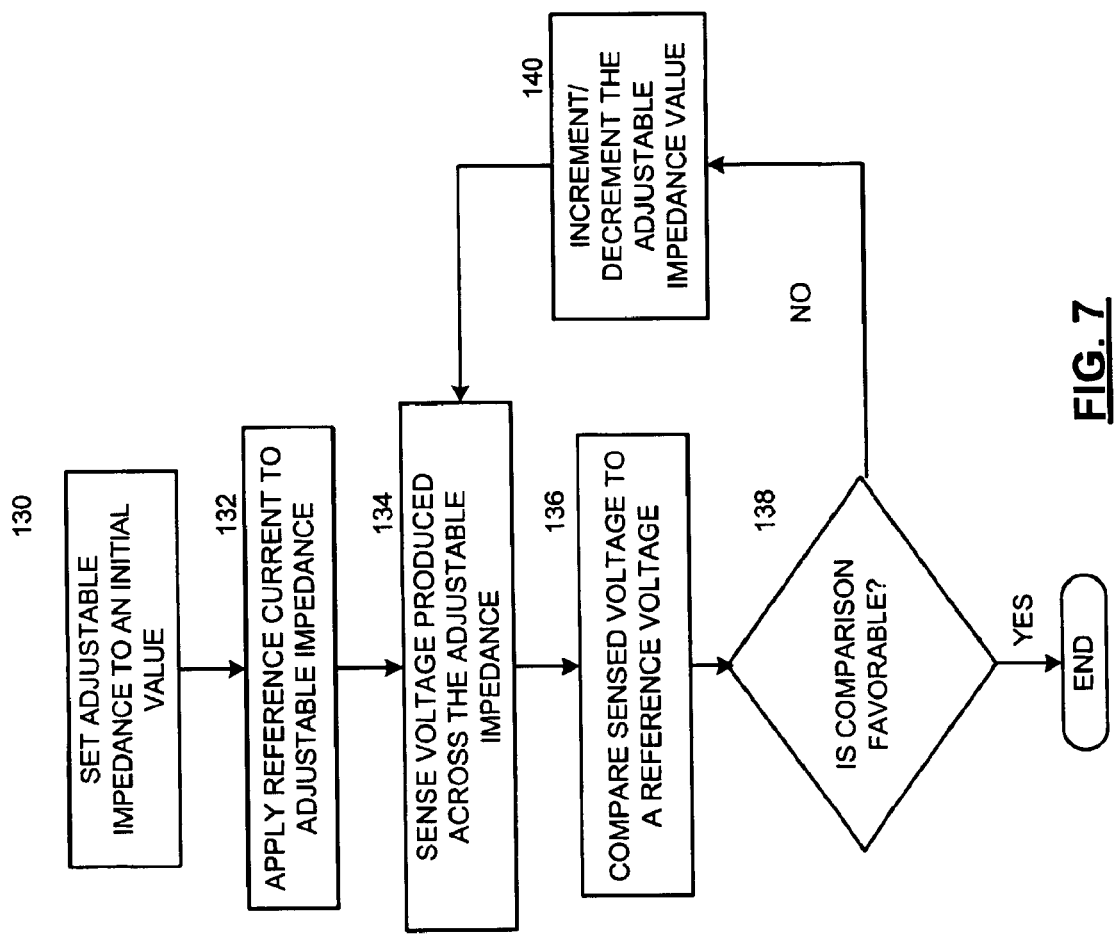
FIG. 7 is a process flow that illustrates another embodiment of adjusting the on-chip impedance in accordance with the present invention.

FIG. 7 provides another logic flow detailing a process by which the tuning of the adjustable on-chip impedance in Step 118 may be achieved. Processing Steps 130–140 tune the adjustable impedance. As previously seen in FIG. 6, the adjustable impedance is set to an initial value at Step 130. After which, a reference current is applied to the adjustable impedance in Step 132. This application results in a voltage, which may be sensed across the adjustable impedance at Step 134. The sense voltage is compared to a reference voltage at Step 136 and at decision point 138 a decision is made as to whether or not the comparison between the sense voltage and the reference voltage is favorable. Step 140 either increments or decrements the adjustable impedance value when the comparison is unfavorable. For example, when the reference voltage is a lower threshold voltage and the comparison is unfavorable, the adjustable impedance may be incremented. Similarly, if the reference voltage is a high level threshold and the comparison is unfavorable, the adjustable impedance may be decremented. This process is iterative and continues until adjustable impedance is incremented or decremented and a favorable comparison exists between the sensed voltage and reference voltage.

Figure 8:
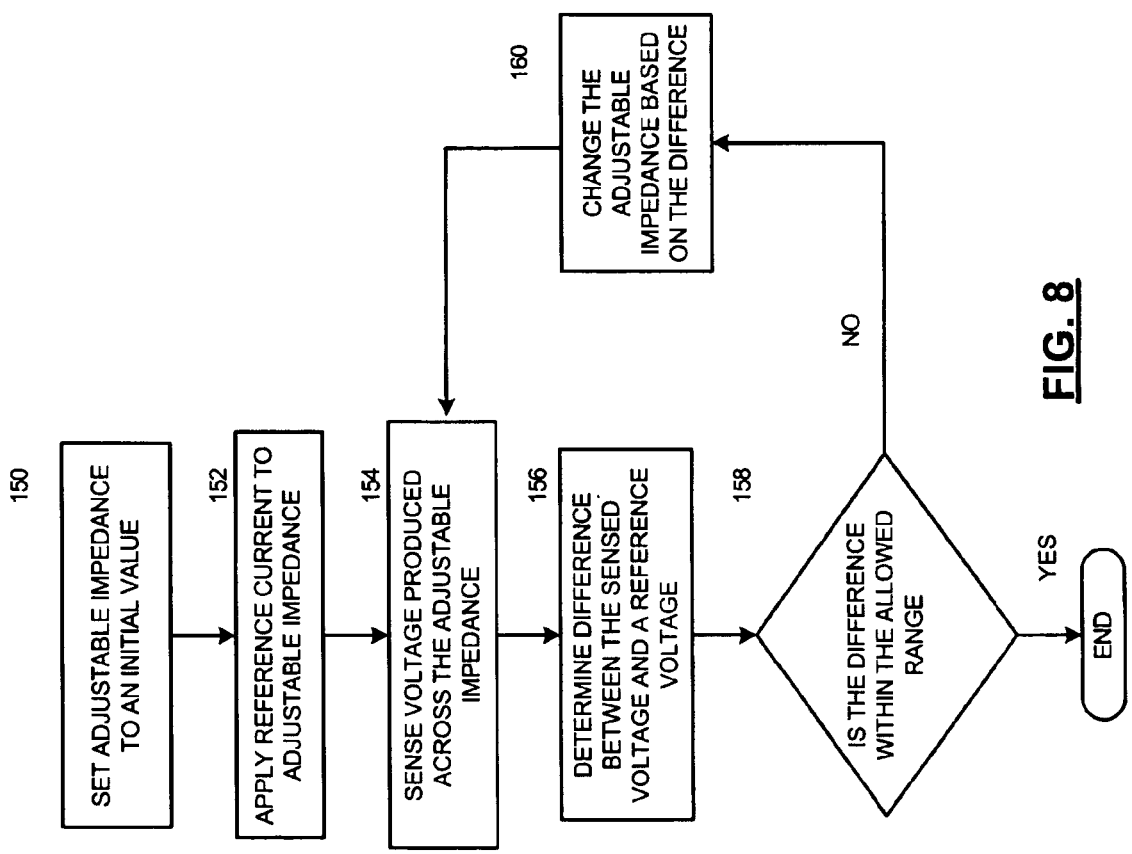
FIG. 8 is a process flow that illustrates another embodiment of adjusting the on-chip impedance in accordance with the present invention.

FIG. 8 is a flow diagram of another method by which the adjustable impedance may be tuned. Here, at Step 150 the adjustable impedance is set to an initial value. The reference current is applied to the adjustable impedance in Step 152 to generate a voltage. The voltage produced in Step 152 is sensed across the adjustable impedance in Step 154. Step 156 determines the difference between the sense voltage and a reference voltage. Decision point 158 examines whether or not the difference is within an allowed range. If the difference is not within an allowed range, the adjustable impedance is altered based on the difference in Step 160 and the process is returned to Step 154 wherein a new voltage is sensed across the altered adjustable impedance. Otherwise, if the difference is within the allowed range the tuning is complete. This method may result in tuning the adjustable impedance in a single step, but allows for iterative tuning of the adjustable impedance.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although the present invention is described in detail, it should be understood that various changes, substitutions and alterations can be made hereto without departing from the spirit and scope of the invention as described by the appended claims.

What is claimed is:

1. A method to establish an adjustable on-chip impedance within a predetermined range, the method comprises:
    establishing a reference current for the adjustable on-chip impedance;
    sensing a voltage produced by applying the reference current to the adjustable on-chip impedance;
    comparing the sensed voltage with a reference voltage; and
    tuning the adjustable on-chip impedance when the comparison of the sensed voltage and the reference voltage is unfavorable, such that an impedance value of the adjustable on-chip impedance is within predetermined range that accounts for variance of the reference current and the reference voltage.

2. The method of claim 1 further comprises setting the impedance value of the adjustable on-chip impedance to an initial value prior to applying the reference current to the adjustable on-chip impedance.

3. The method of claim 2, wherein the initial value of the adjustable on-chip impedance comprises at least one of a minimum impedance value, a maximum impedance value, and a nominal impedance value.

4. The method of claim 1, wherein tuning the adjustable on-chip impedance further comprises:
    changing the impedance value to produce an altered impedance value;
    applying the reference current to the adjustable on-chip impedance having the altered impedance;
    sensing the voltage produced by applying the reference current to the adjustable on-chip impedance having the altered impedance; and
    comparing the sensed voltage with the reference voltage, wherein tuning the adjustable on-chip impedance continues when the comparison of the sensed voltage and the reference voltage is unfavorable.

5. The method of claim 1, wherein tuning the adjustable on-chip impedance further comprises:
    determining a voltage difference between the sensed voltage and the reference voltage; and
    determining an impedance adjustment to the adjustable on-chip impedance based on the voltage difference.

6. The method of claim 1, wherein comparing the sensed voltage with a reference voltage further comprises:
    comparing the sensed voltage with a first reference voltage, wherein the first reference voltage corresponds to a low threshold of the range of acceptable impedance values; and
    comparing the sensed voltage with a second reference voltage, wherein the second reference voltage corresponds to a high threshold of the range of acceptable impedance values.

7. The method of claim 1, wherein the adjustable on-chip impedance corresponds to a termination resistor for universal serial bus (USB) transmit lines.

8. A calibration circuit to establish an impedance value of an adjustable on-chip impedance within a predetermined range, comprising:
    a reference current source to provide a reference current, which is applied across the adjustable on-chip impedance;
    a comparator operably coupled to sense and compare a voltage generated across the adjustable on-chip impedance, and a reference voltage, and wherein the comparator provides an output that indicates when the comparison of the sensed voltage and the reference voltage is unfavorable; and
    a tuning module to receive the output of the comparator and to increment the adjustable on-chip impedance when the comparison of the sensed voltage and the reference voltage is unfavorable such that an impedance value of the adjustable on-chip impedance is within a predetermined range that accounts for variance of the reference current and the reference voltage.

9. The calibration circuit of claim 8, wherein the reference current and reference voltage derive from a bandgap voltage reference.

10. The calibration circuit of claim 9, wherein:
    the tuning module changes the impedance value to produce an altered impedance value of the adjustable on-chip impedance to which the reference current is applied;
    the comparator compares the sensed voltage produced by applying the reference current to the adjustable on-chip impedance and the reference voltage; and
    wherein tuning module continues to change the adjustable on-chip impedance when the comparison of the sensed voltage and the reference voltage is unfavorable.

11. The calibration circuit of claim 8, wherein the reference current source comprising a current mirror, which provides at least some of the variance of the reference current.

12. The calibration circuit of claim 8, wherein the adjustable on-chip impedance corresponds to a termination resistor for universal serial bus (USB) transmit lines.

* * * * *